US012803143B2

(12) United States Patent
Simon et al.

(10) Patent No.: US 12,803,143 B2
(45) Date of Patent: Nov. 17, 2026

(54) RECONFIGURABLE FILTERING DEVICE AND SYSTEM FOR ACQUIRING RADIOFREQUENCY SIGNALS INCORPORATING SUCH A FILTERING DEVICE

(71) Applicants: THALES, Meudon (FR); Centre national de la recherche scientifique, Paris (FR); Universite de Bretagne Occidentale (U.B.O), Brest (FR)

(72) Inventors: Hervé Simon, Brest (FR); Fabien Le Borgne, Brest (FR); Loïc Thepaut, Brest (FR); Afshin Ziaei, Palaiseau Cedex (FR); Matthieu Le Baillif, Palaiseau Cedex (FR); José Paolo Martins, Palaiseau Cedex (FR); Benjamin Potelon, Brest Cedex (FR); Cédric Quendo, Brest Cedex (FR)

(73) Assignees: THALES, Meudon (FR); CENTRE NATIONAL DE LA RECHERCHE SCIENTIFIQUE PARIS, FRANCE, Paris (FR); UNIVERSITE DE BRETAGNE OCCIDENTALE (U.B.O.), Brest (FR)

( * ) Notice: Subject to any disclaimer, the term of this patent is extended or adjusted under 35 U.S.C. 154(b) by 253 days.

(21) Appl. No.: 18/706,218

(22) PCT Filed: Nov. 4, 2022

(86) PCT No.: PCT/EP2022/080790

§ 371 (c)(1),
(2) Date: Apr. 30, 2024

(87) PCT Pub. No.: WO2023/079065

PCT Pub. Date: May 11, 2023

(65) Prior Publication Data

US 2026/0142360 A1 May 21, 2026

(30) Foreign Application Priority Data

Nov. 5, 2021 (FR) ...................................... 2111760

(51) Int. Cl.
*H01P 1/203* (2006.01)
*H01P 3/08* (2006.01)
(Continued)

(52) U.S. Cl.
CPC .............. *H01P 1/203* (2013.01); *H01P 3/081* (2013.01); *H03H 2007/006* (2013.01);
(Continued)

(58) Field of Classification Search
CPC ... H01P 1/203; H01P 3/081; H03H 2007/006; H03H 2015/005; H03J 2200/19; H03J 2200/39
(Continued)

(56) References Cited

U.S. PATENT DOCUMENTS 6,452,465 B1 9/2002 Brown et al.
2004/0036558 A1 * 2/2004 Allison .................. H01P 1/203 333/205

(Continued)

OTHER PUBLICATIONS

Latip, M. A. Abdul , et al., "Tuning Circuit Using Varactor Diode for Tunable Bandstop Resonator" 2011 IEEE Symposium on Wireless Technology and Applications (ISWTA), Sep. 25-28, 2011, 4 pages.

(Continued)

*Primary Examiner* — Andrea Lindgren Baltzell
*Assistant Examiner* — Victor Cole
(74) *Attorney, Agent, or Firm* — Soquel Group LLC

(57) ABSTRACT

A filtering device including a transmission line between an input and an output and a resonator, wherein a first microstrip track, a first micro-electromechanical system (MEMS) component, and a second microstrip track are
(Continued)

connected in series between the transmission line and a ground point, and a second MEMS component is connected in parallel with the second microstrip track, the first and second MEMS components being switchable and being controlled by a circuit controlling the open or closed state of each of the first and second MEMS components, allowing the filtering device to be placed either in an all-pass operating mode or in a band-stop operating mode about a characteristic frequency of the resonator.

10 Claims, 7 Drawing Sheets

(51) Int. Cl.
*H03H 7/00* (2006.01)
*H03H 15/00* (2006.01)

(52) U.S. Cl.
CPC .... *H03H 2015/005* (2013.01); *H03J 2200/19* (2013.01); *H03J 2200/39* (2013.01)

(58) Field of Classification Search
USPC .......................................................... 333/204
See application file for complete search history.

(56) References Cited

U.S. PATENT DOCUMENTS

| | | | |
|---|---|---|---|
| 2006/0273869 | A1 | 12/2006 | Jachowski |
| 2010/0237965 | A1 | 9/2010 | Mi et al. |
| 2014/0176263 | A1* | 6/2014 | Giraudo ............... H03H 7/0138 333/205 |
| 2020/0389149 | A1 | 12/2020 | Gudeman |

OTHER PUBLICATIONS

PCT /EP2022/080790, International Search Report, Mar. 1, 2023, 2 pages.
FR 2111760, INPI Rapport de Recherche Preliminaire, Jun. 17, 2022, 2 pages.

* cited by examiner

RECONFIGURABLE FILTERING DEVICE AND SYSTEM FOR ACQUIRING RADIOFREQUENCY SIGNALS INCORPORATING SUCH A FILTERING DEVICE

CROSS-REFERENCE TO RELATED APPLICATIONS

This application claims benefit under 35 USC § 371 of PCT Application No. PCT/EP2022/080790 entitled RECONFIGURABLE FILTERING DEVICE AND SYSTEM FOR ACQUIRING RADIO-FREQUENCY SIGNALS INCORPORATING SUCH A FILTERING DEVICE, filed on Nov. 4, 2022 by inventors Fabien Le Borgne, Loïc Thepaut, Hervé Simon, Afshin Ziaei, Matthieu Le Baillef, José Paolo Martins, Benjamin Potelon and Cédric Quendo. PCT Application No. PCT/EP2022/080790 claims priority of French Patent Application No. 21 11760, filed on Nov. 5, 2021.

FIELD OF THE INVENTION

The field of the present invention is that of the filtering of microwave signals.

BACKGROUND OF THE INVENTION

The rise of telecommunications in various fields has overburdened the electromagnetic spectrum with many signals that are parasitic signals for applications such as reception for a radar system or else listening for an electronic warfare system.

It is thus necessary to reject signals in certain specific frequency bands.

To this end, it is known how to use reconfigurable or frequency tunable filters. For example, radiofrequency switches, also called "RF switches", such as "PIN" switches or electromechanical switches, are known, serving to switch the signal to be filtered to one filtering device rather than another, depending on the processing that it is desired to apply to the signal.

It is also known how to use varactor diodes. A varactor diode is also called varicap, tuning diode, voltage variable capacitor, parametric diode, or else variable capacitor diode.

As shown in FIG. 7, a varactor diode filtering device 10 has an input terminal 1, to which the signal to be filtered is applied, and an output terminal 2, to which the filtered signal is delivered. The filter includes a transmission line 13 connecting the input terminal 1 to the output terminal 2. A resonator 14 is connected between a node A of the transmission line 13 and a node B, which is brought to a reference potential, such as a ground potential. The resonator 14 includes a quarter-wave track 16 and a varactor diode 18 in series.

The article by A. A. Latip et al., "Tuning circuit using varactor diode for tunable bandstop resonator", 2011 IEEE, describes such a varactor diode filtering device. More particularly, the article presents an electrical circuit equivalent to such a varactor diode.

However, the multiplication of such filtering devices in the transmission and reception chains of an acquisition system of radiofrequency signals (radar or electronic warfare system) reduces sensitivity and increases the bulk.

SUMMARY OF THE DESCRIPTION

Therefore, the goal of the present invention is to solve such problems by proposing in particular a filtering device having better sensitivity and a reduced volume.

To this end, the subject matter of the invention is a reconfigurable filtering device including: an input terminal to which a signal to be filtered is applied; an output terminal to which a filtered signal is delivered; a transmission line connecting the input terminal and the output terminal, and a resonator connected, via a first capacitor, to the transmission line and, via a second capacitor, to a first node brought to a reference potential, characterized in that the resonator includes: a first microstrip track connected to the first capacitor and to a first intermediate node; a second microstrip track connected to a second intermediate node and to the second capacitor; a first micro-electromechanical system (MEMS) component connected between the first intermediate node and the second intermediate node so as to be placed in series between the first and second microstrip tracks; a second MEMS component, connected between the second intermediate node and a second node brought to the reference potential so as to be placed in parallel with the second microstrip track, the first and second MEMS components operating as a switch and being controlled by a control device for the open or closed state of each of the first and second MEMS enabling the filtering device to be placed in either an "all-pass" operating mode, or in a "band-stop" operating mode around a characteristic frequency of the resonator.

According to particular embodiments, the filtering device includes one or more of the following features, taken individually or according to all technically possible combinations:

- a plurality of resonators, the resonators being similar and connected in parallel along the transmission line, the control device serving to select the number of resonators in the band-stop operating mode so as to adjust a rejection level of the filtering device.
- the plurality of resonators including a first plurality of first resonators characterized by a first characteristic frequency, the plurality of resonators including a second plurality of second resonators, the second resonators being characterized by a second characteristic frequency, the control device selecting the number of resonators in the band-stop operating mode to adjust a rejection level of the filtering device around the first characteristic frequency or around the second characteristic frequency.
- the first capacitor and/or the second capacitor is a metal—insulator—metal capacitor.
- the first microstrip track of the resonator has a first impedance and the second microstrip track of the resonator has a second impedance, the first and second impedances being different so that the resonator has an impedance jump.
- the first MEMS component and/or the second MEMS component of the resonator is a capacitive MEMS component.
- the first and second MEMS components include, respectively, a membrane suspended by the ends thereof above a contact, the application by the control device of an actuation potential on the membrane and/or contact deforming the membrane so as to establish electrical continuity between the membrane and the contact.
- the control device includes a resistive line section used to bring the contact to the actuation potential.
- an end portion of the resistive line section, located close to the contact, is shaped in a meander so as to have a high resistance for the contact.

A further subject matter of the invention relates to a system for acquiring microwave signals, the transmission and/or reception channels of which incorporate a filtering device according to the preceding device.

BRIEF DESCRIPTION OF THE DRAWINGS

The invention and the advantages of the invention will better understood upon reading the following detailed description of the two particular embodiments of the invention, given only as an illustrative example and not limited to, the description being made with reference to the enclosed drawings, wherein.

DETAILED DESCRIPTION OF EMBODIMENTS

The present invention uses MEMS (MicroElectroMechanical Systems) components. A MEMS component is a micro-electromechanical system of micrometric dimensions, which is manufactured from semiconductor materials. Same comprises at least one mechanical element and uses electricity as a source of energy. Same is suitable for performing a particular function (actuator, sensor, switch, etc.).

Figure 1:
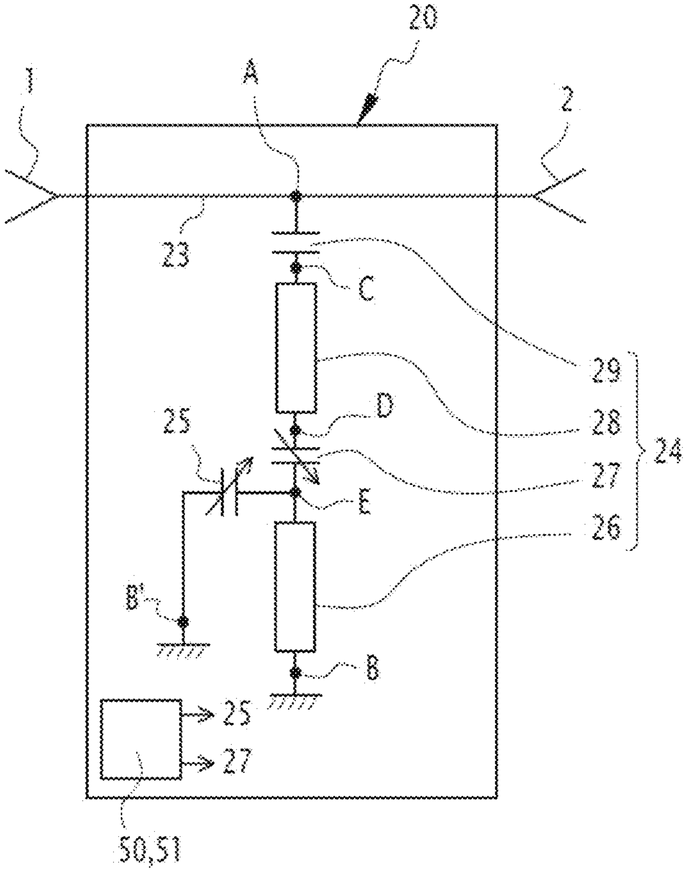
FIG. 1 is an equivalent electrical diagram in the high frequency domain of a first embodiment of a filtering device according to the invention.

According to a first embodiment, an equivalent electrical diagram of which for operation in the microwave range is shown in FIG. 1, the filtering device 20 includes an input terminal 1 to which the signal to be filtered is applied and an output terminal 2 to which the filtered signal is delivered.

The filtering device 20 includes a transmission line 23 connecting the input terminal 1 to the output terminal 2.

The filtering device 20 includes a resonator 24 connected as a branch-off of the transmission line 23 between a node A and a node B. The node B is brought to a reference potential (such as a ground potential). The resonator 24 is characterized by a characteristic resonant frequency $F_0$.

In the embodiment shown in FIG. 1, the resonator 24 includes:

- a capacitor 29, connected between the node A and a node C;
- a first transmission line 28, connected between the node C and a node D;
- a first MEMS component 27, connected between the node D and a node E;
- a second transmission line 26, connected between the node E and a node B;
- a second MEMS device 25, connected in parallel with the second transmission line 26, between the node E and a node B', which is brought to the reference potential; and,
- control circuits 50 and 51 for the status of the first and second MEMS components.

The first and second transmission lines 28 and 26 are microstrip track sections. The first transmission line 28 is shaped to have an impedance $Z_1$ and to bring in an electrical length $\theta_1$ at the resonance frequency $F_0$. The second transmission line 26 is shaped to have an impedance $Z_2$ and to bring in an electrical length $\theta_2$ at the resonance frequency $F_0$.

The impedances of the two transmission lines, 28 and 26, are different so as to bring in an impedance jump, having the advantage of pushing the harmonics of the characteristic frequency $F_0$ toward high frequencies, outside the frequency domain of interest.

It is at such impedance jump that the first MEMS component 27, also called series MEMS, and the second MEMS component 25, or shunt MEMS are placed.

The first and second MEMS components perform a controlled switch function. Same have two states, respectively: an "open" (or blocking) state and a "closed" (or passing) state.

The MEMS components used in the resonator 24 are preferentially capacitive MEMS components, i.e. in the closed state same behave like a residual capacitor and not like a perfect switch.

Depending on the states of the MEMS components 27 and 25, the filtering device 20 is placed either in a first operating mode or in a second operating mode.

Thereby, by controlling the first MEMS component 27 in the closed state and the second MEMS component 25 in the open state, the device 20 is placed in a "band-stop" (or "rejector") mode of signals in a frequency band $\Delta F_0$ around the characteristic frequency $F_0$.

By controlling the first MEMS component in the open state and the second MEMS component in the closed state, the filtering device 20 is placed in an all-pass mode, at least on the frequency domain of interest.

It should be noted that the first "series" MEMS component could theoretically suffice to obtain a filtering device the operating mode of which can be controlled. However, in practice the second "shunt" MEMS component is necessary to improve performance, in particular to improve insulation when the first "series" MEMS component is in the open state.

Figure 2:
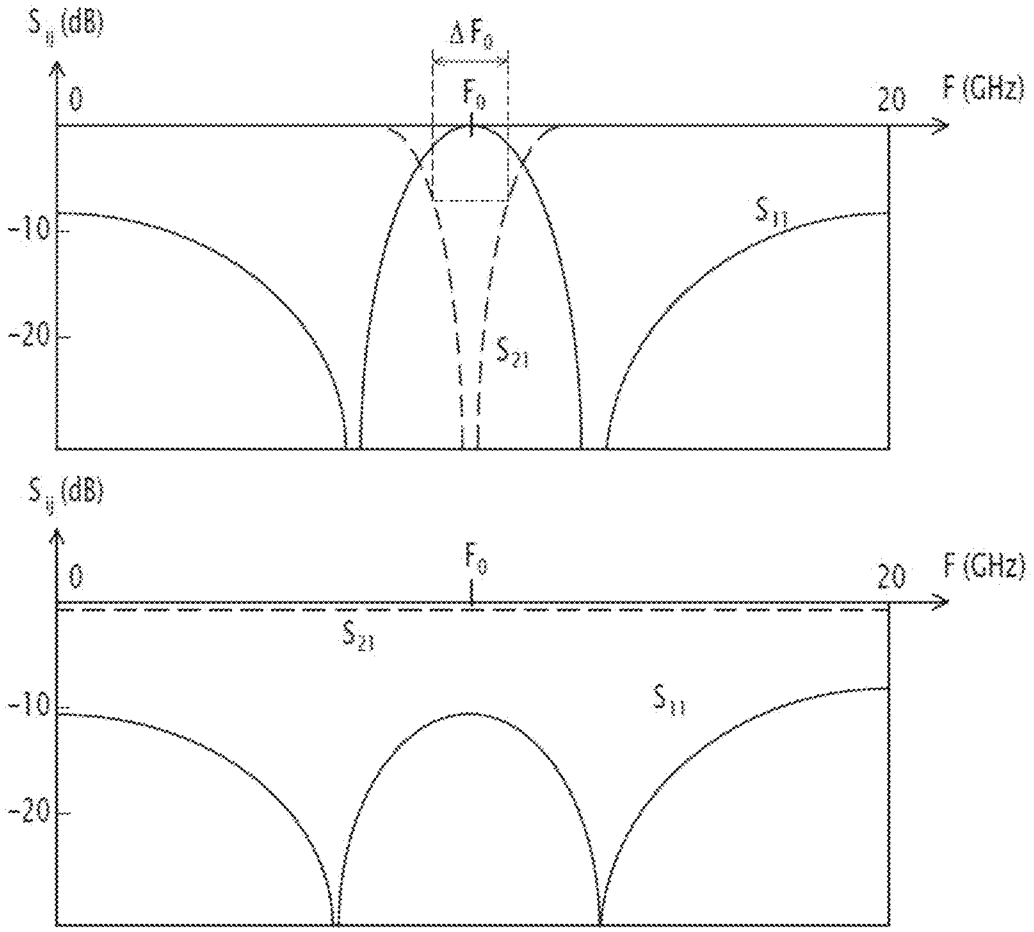
FIG. 2 shows two graphs of the parameters $S_{ij}$ (dB) as a function of the frequency F (GHz) of the signal applied to the input terminal for the filtering device shown in FIG. 1 according to the selected operating mode.

Such behavior is shown in FIG. 2. The transmission parameter $S_{21}$ corresponds to the power transmitted from the input terminal 1 to the output terminal 2 of the device 20, whereas the reflection parameter $S_{11}$ represents the power reflected by the filtering device 20 on the input terminal 1.

The graph in the upper part of FIG. 2 represents the parameters $S_{21}$ and $S_{11}$ as a function of the frequency of the filtering device 20 in the band-stop mode: the parameter $S_{21}$ is weak around the characteristic frequency $F_0$ so that the signals to be filtered having a frequency within the $\Delta F_0$ band are strongly attenuated, i.e. are not retransmitted to the output terminal 2. The power reflected by the device 20 is then maximum ($S_{11}$ reaches a maximum close to the zero value on the band $\Delta F_0$) and the signals to be filtered of the band $\Delta F_0$, are rejected.

The graph in the lower part of FIG. 2 represents the parameters $S_{21}$ and $S_{11}$ as a function of the frequency (F) of the filtering device 20 in the all-pass mode: the parameter $S_{21}$ is substantially uniform and close to the unit value over the entire frequency domain of interest, while the parameter $S_{11}$ remains low (less than −10 dB) over the entire domain.

In the all-pass mode, the second transmission line 26 is deactivated so as to greatly reduce the overall electrical length of the resonator 24.

The installation position of the MEMS components is also defined in such a way as to obtain a compromise between the characteristic frequency $F_0$ and the electrical performance of the filtering device.

The impedance jump present between the two transmission lines adds flexibility in the design of the filtering device, in particular with regard to the selectivity of the filtering device and to the rejection of spurious feedback, more particularly in rejecting harmonics of the resonant frequency outside the frequency domain of interest.

The capacitor 29 is preferentially a MIM (metal-insulator-metal) capacitor. A MIM capacitor is a so-called planar capacitor produced by the superposition of two conductor layers between which a dielectric layer is inserted. Same is thus a semi-localized capacitor with extremely small dimensions and hence easy to integrate.

Using such a capacitor has the following advantages:

isolation of the DC component of the MEMS control signal (as will be described hereinbelow) toward the input terminals 1 and output terminals 2 of the filtering device, which protects the electronic components downstream and upstream of the filtering device;

increase in filter selectivity, i.e. decrease of the band width $\Delta F_0$.

ejection of spurious feedback (harmonics) outside the desired operating range.

Figure 3:
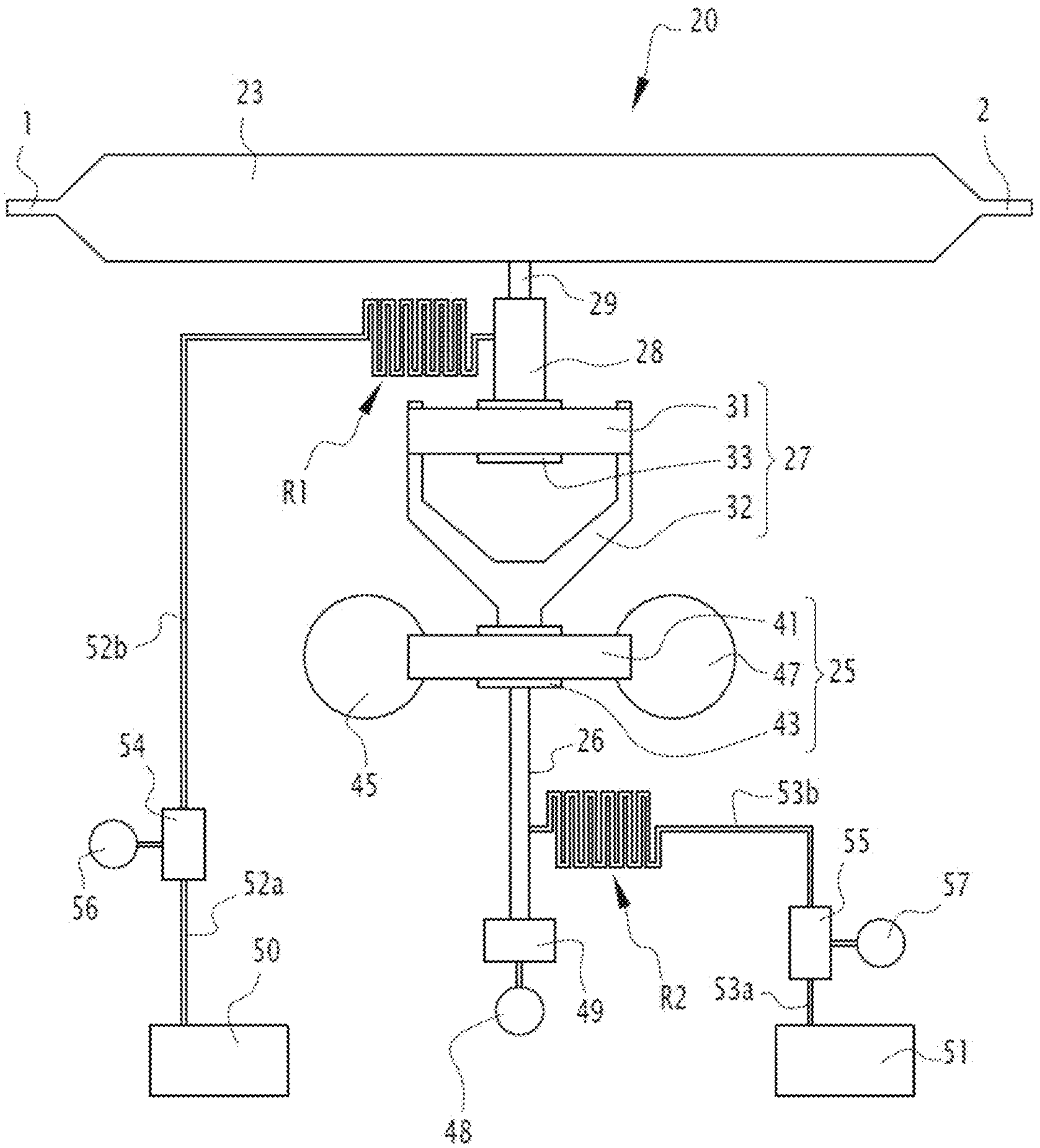
FIG. 3 is a diagram of an embodiment of the filtering device shown in FIG. 1.

FIG. 3 is a physical use of the filtering device 20 shown in FIG. 1.

The filtering device 20 includes a line 23 between the input 1 and output 2 terminals. The line 23 is connected to the upper layer of the capacitor MIM 29.

The lower layer of the capacitor MIM 29 is connected to a first end of the first transmission line 28, the second end of the first transmission line 28 carrying a contact 33 of the first capacitive MEMS component 27.

The first capacitive MEMS component 27 consists of a flexible membrane 31 with an oblong shape, the ends of which are carried by a yoke 32, so that, in the open state, the membrane 31 is maintained suspended above and at a distance from the contact 33.

When the first transmission line 28 is brought to a predefined actuation potential (e.g. +40V) applied by a first bias device, the electrostatic force between the contact 33 and the membrane 31 is such that the latter is attracted and almost sticks against the contact 33, thereby providing electrical continuity (at least from a radiofrequency point of view since the residual capacitor cuts off the DC component) between the first transmission line 28 and the yoke 32.

The second capacitive MEMS component 25 consists of a flexible membrane 41 with an oblong shape, the ends of which are herein supported by pads, 45 and 47, respectively, brought to the reference potential (the pads are e.g. connected, by means of metalized vias, to an underlying ground plane). In the open state, the membrane 41 is suspended above a contact 43, arranged so as to establish electrical continuity between the yoke 32 of the first capacitive MEMS component 27 and a first end of the second transmission line 26, the second end of which is connected, through a capacitor 49, preferentially a MIM, to a pad 48 brought to the reference potential (node B).

When the second transmission line 26 is brought to a predefined actuation potential (e.g. +40V) by a second bias device, the yoke 32 is at the same potential as the contact 33, so that the first capacitive MEMS component 27 switches to the open state. Simultaneously, the electrostatic force between the contact 43 and the membrane 41 serves to move the latter and bring same into the immediate vicinity of the contact 43, thereby providing electrical continuity (at least from a radiofrequency point of view since the residual capacitor cuts off the DC component) between the yoke 32 of the first capacitive MEMS component 27 and the pads 45 and 47, enabling the yoke 32 to be brought to the reference potential, the second transmission line 26 then being shunted.

A capacitor 49 should be added between the end of the resonator and the node B (consisting of the pad 48 connected to the reference potential) to act as a decoupling capacitor enabling the second line 26 to be brought to the actuation potential. In the microwave domain, the presence of the decoupling capacitor (of high value) has no effect, unlike the capacitor 29.

RC circuits are chosen as bias circuits, composed of a resistive line section meandered in order to enhance the resistive effect in the vicinity of the transmission line used to control the state of the MEMS component associated with the line and a MIM capacitor brought to the ground.

Thereby, the first bias circuit consists of a line section **52*a* and 52*b* between a first control circuit 50 and the first transmission line 28. Advantageously, the end of the line section is shaped like a meander so as to have a high resistance R1 in the vicinity of the first transmission line 28 so as not to disturb the resonator function. In addition, a capacitor 54, preferentially a MIM, is connected between the line section and a metalized via 56 connected to the ground plane. For example, the upper layer of the MIM capacitor 54 is connected to the first and second portions 52*a* and 52*b* of the line section, while the lower layer of the MIM capacitor 54 is connected to the via 56**.

The second bias circuit consists of a line section **53*a* and 53*b* between a second control circuit 51 and the second transmission line 26. Advantageously, the end of the line section is shaped like a meander so as to have a high resistance R2 in the vicinity of the second transmission line 26 so as not to disturb the resonator function. In addition, a capacitor 55, preferentially a MIM, is connected between the line section and a metalized via 57 connected to the ground plane. For example, the upper layer of the MIM capacitor 55 is connected to the first and second portions 53*a* and 53*b* of the line section, while the lower layer of the MIM capacitor 55 is connected to the via 57**.

Figure 4:
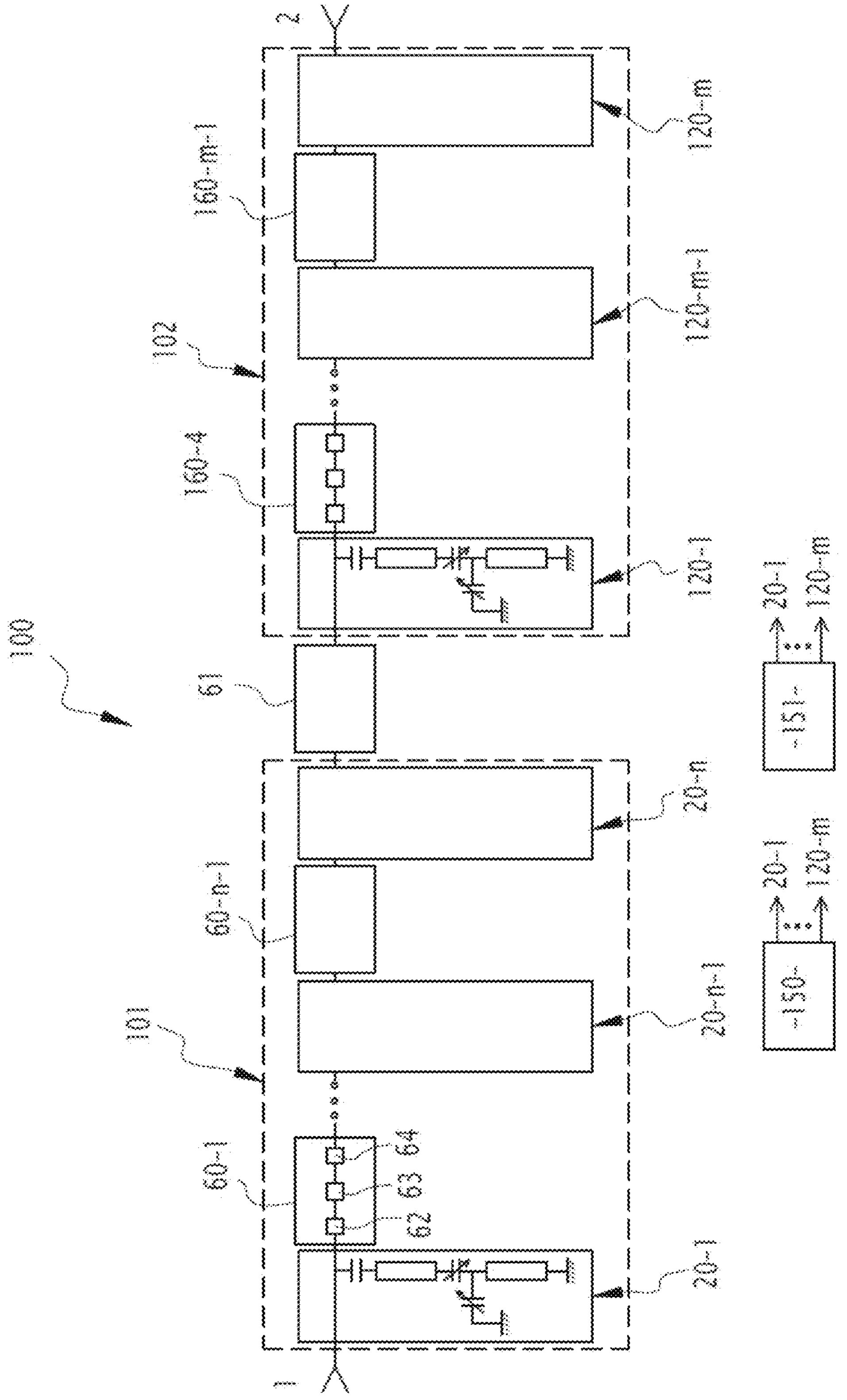
FIG. 4 is an equivalent electrical diagram in the high frequency domain of a second embodiment of a filtering device according to the invention.

FIG. 4 illustrate a second embodiment of the filtering device according to the invention.

The device 100 includes, arranged in series between an input 1 and an output 2, a first module 101 and a second module 102. The first and second modules are separated by an impedance matching element 61.

The first module 101 consists of the parallel connection of a plurality of n resonators 20-1, . . . , **20-*n*−1, 20-*n*, between the transmission line and the ground. The resonators are identical to each other and each resonator is similar to the device 20 shown in FIG. 1**. The different resonators are identical to each other and the parameters thereof are chosen so that all resonators have the same frequency $F_0$ and the same rejection band $\Delta F_0$.

Between two successive resonators, the transmission line incorporates an impedance matching element. Thereby, the matching line includes elements 60-1, . . . **60-*n*−1. Each matching element consists e.g. of the series connection of matched impedance components 62, 63, 64**.

Similarly, the second module 102 consists of a plurality of m resonators, 120-1, . . . , 120-$m$-1, 120-$m$, arranged in parallel between the transmission line and the ground. An impedance adjustment element is interposed between two successive resonators. Thereby, the transmission line includes elements 160-1, . . . , 160-$m$-1, 160-$m$.

The different resonators are identical and chosen so that the resonators have the same frequency $F_1$ and the same rejection band $\Delta F_1$.

The device 100 is equipped with first and second bias circuits 150 and 151 apt to individually control the state of each of the resonators 20-1 to 120-$m$.

Thereby, the device 100 can operate in the all-pass mode provided that all the resonators of the first module 101 are in the all-pass mode and all the resonators of the second module 102 are in the all-pass mode.

The device 100 can operate in a band-stop mode around the frequency $F_0$. For this purpose, all the resonators of the second module 102 are in the all-pass mode and all or part of the resonators of the first module 101 are in the band-stop mode. The rejection level can be adjusted by selecting the number of resonators that are placed in the band-stop mode and the number of resonators that are placed in the all-pass mode.

Similarly, the device 100 can operate in a band-stop mode around the frequency $F_1$. For this purpose, all the resonators of the first module 101 are placed in the all-pass mode, whereas all or part of the resonators of the second module 102 are placed in the band-stop mode. The number of resonators in the band-stop mode determines the rejection level of the filtering device 100.

Figure 5:
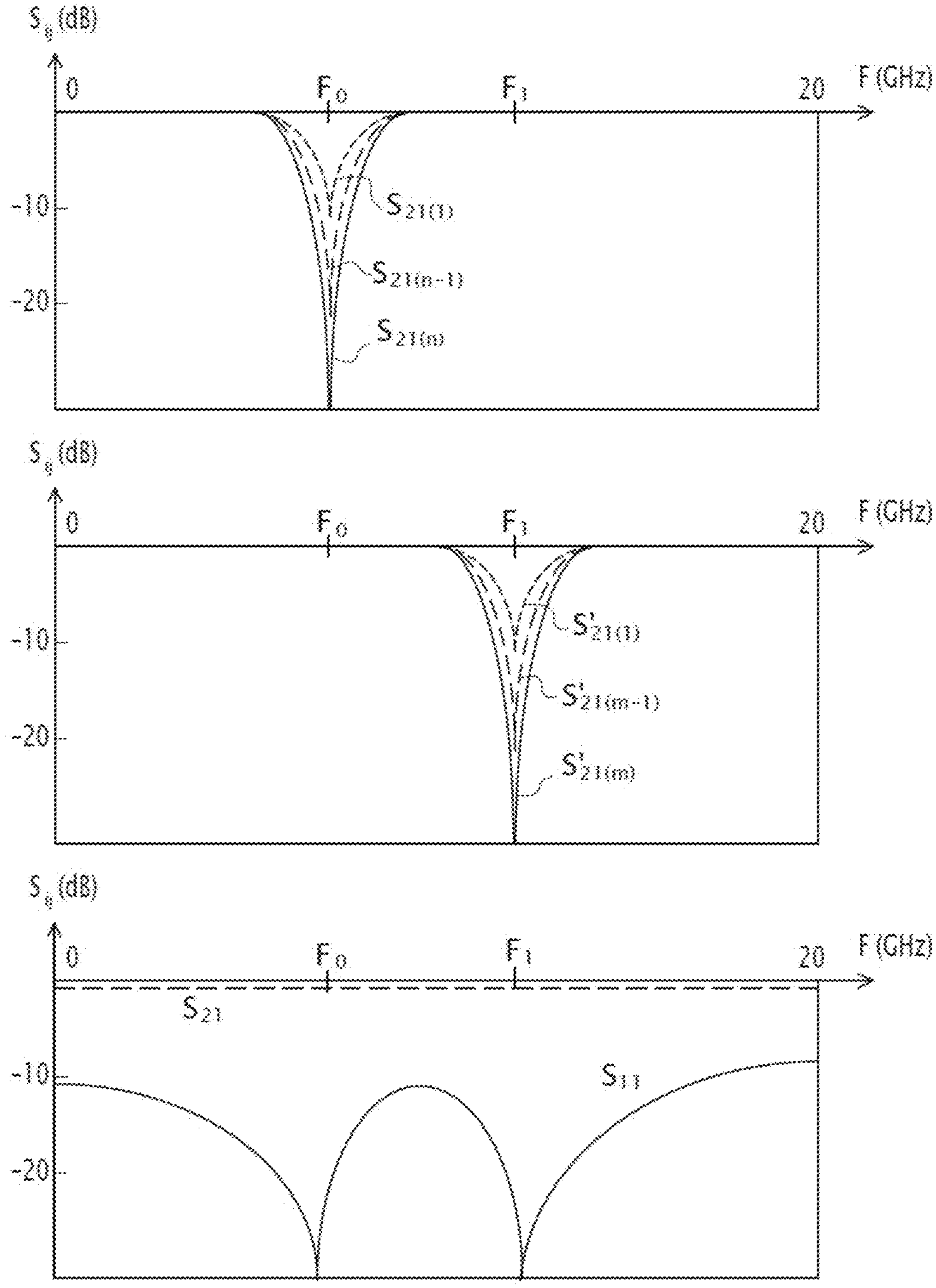
FIG. 5 shows two graphs of the parameters $S_{ij}$ (dB) as a function of the frequency F (GHz) of the signal applied to the input terminal for the filtering device shown in FIG. 4, according to the selected operating mode.

The behavior of the filtering device of FIG. 4 for each operating mode is illustrated by the graphs shown in FIG. 5 giving the parameters $S_{ij}$ as a function of the frequency F of the signal applied to the input 1 of the device 100.

The graph in the lower part of FIG. 5 represents the operation of the device 100 in the all-pass mode. The parameter $S_{21}$ is substantially constant over the entire frequency domain, whereas the parameter $S_{11}$ remains low over the entire frequency domain. The above means that the device 100 lets through the entire power regardless of the frequency of the incoming signal to be filtered.

The graph in the upper part of FIG. 5 represents the band-stop mode around the frequency $F_0$. The different curves represent the parameter $S_{21}$ as a function of the number of resonators used to attenuate the signal in the band $\Delta F_0$. The curve $S_{21}(1)$ corresponds to the case where only the first resonator 20-1 is placed in the band-stop mode, the curve $S_{21}(n-1)$ corresponds to the case where the first n−1 resonators 20-1 are placed in band-stop mode, and the curve $S_{21}(n)$ corresponds to the case where the n resonators 20-1 are placed in the band-stop mode.

The graph of the central part of FIG. 5 represents the band-stop mode around the frequency $F_1$. The different curves represent the parameter $S_{21}$ as a function of the number of resonators used to attenuate the signal in the band $\Delta F_1$. The curve $S'_{21}(1)$ corresponds to the case where only the first resonator 120-1 is placed in band-stop mode, the curve $S'_{21}(m-1)$ corresponds to the case where the first m−1 resonators 20-1 are placed in band-stop mode, and the curve $S_{21}(m)$ corresponds to the case where the m resonators are placed in the band-stop mode.

Figure 6:
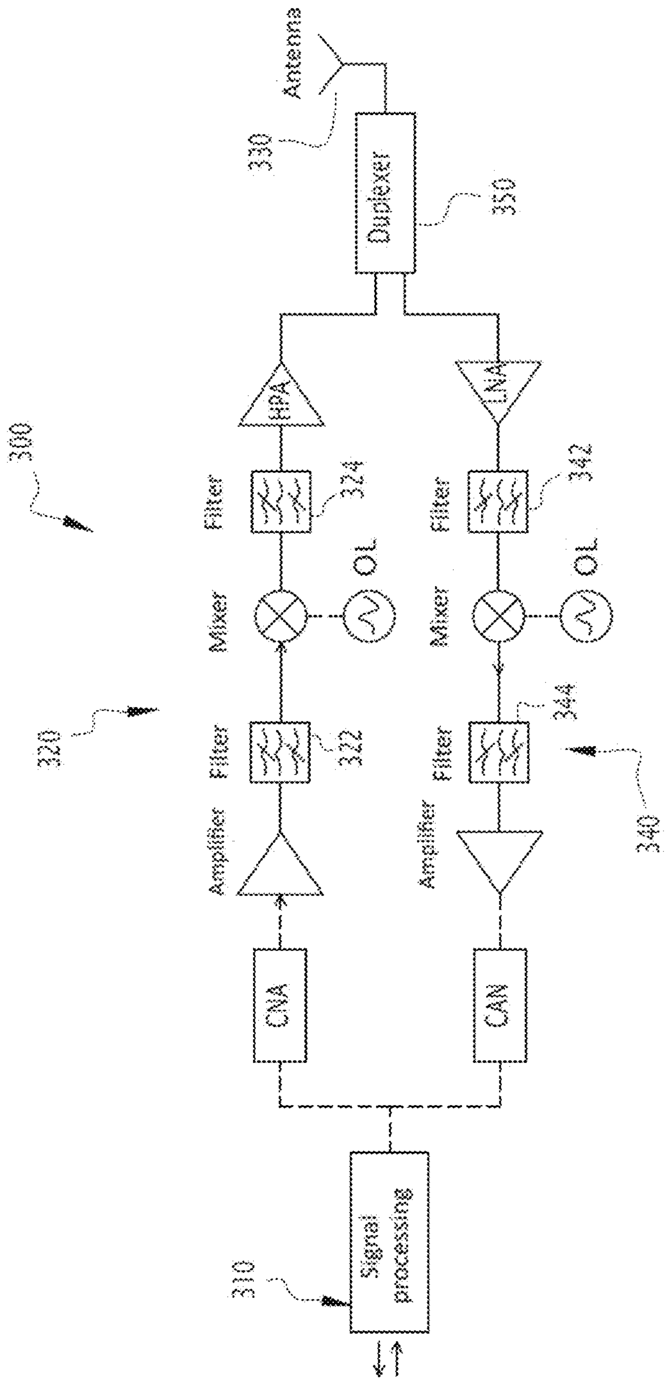
FIG. 6 schematically represents the transmission and reception channels of a radar system incorporating one or a plurality of filtering devices according to the invention; and, FIG. 7 is a diagram of an embodiment of a varactor diode filtering device according to the prior art.
Figure 7:
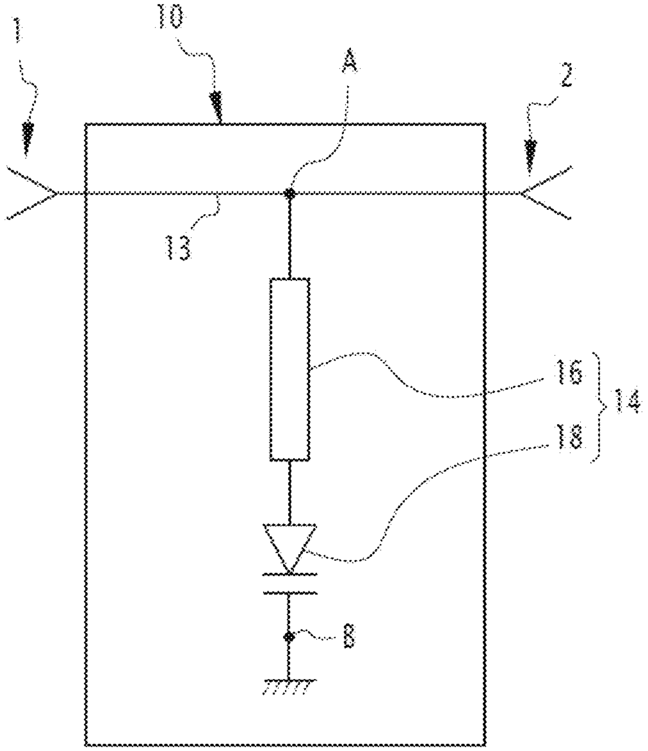
(PRIOR ART) FIG.7

FIG. 6 schematically represents a radar system incorporating one or a plurality of filtering devices according to the invention. The system 300 includes, in a manner known per se, a signal processing module 310, a transmission channel 320, an antenna 330, a reception channel 340 and a duplexer 350 interposed between the transmission channel 320 and the antenna 330, on the one hand, and the antenna 330 and the reception channel 340, on the other hand.

The transmission channel 320 comprises successively e.g. a digital-to-analog conversion component CNA, an amplifier, a first filter 322, a mixer, a second filter 324 and then a high-power amplifier HPA. The mixer takes into account a clock signal delivered by a local clock OL.

Similarly, the reception line 340 comprises a low noise amplifier LNA followed by a third filter 342, as such followed by a mixer the output signal of which is sent to a fourth filter 344. The signal is then amplified by passing through an amplifier before being digitized using an analog-to-digital converter ADC. The mixer of the receive channel takes into account the clock signal of a local oscillator OL.

Preferentially, the third filter 342 is a filtering device according to the invention, either the device 20 shown in FIG. 1 or the device 100 shown in FIG. 4.

Alternatively, the first, second, third and/or fourth filters 322, 324, 342 and/or 344 are filtering devices according to the invention.

The control of the current state of the filtering device serves to suppress such or such region of the frequency domain of the application wherein there is a risk of having spurious signals.

The invention claimed is:

1. A reconfigurable filtering device comprising:

- an input terminal to which a signal to be filtered is applied;
- an output terminal to which a filtered signal is delivered;
- a transmission line connecting said input terminal and said output terminal; and
- a resonator connected, via a first capacitor, to said transmission line and, via a second capacitor, to a first node brought to a reference potential, the resonator comprising:
  - a first microstrip track, connected both to the first capacitor and to a first intermediate node;
  - a second microstrip track, connected both to a second intermediate node and to the second capacitor;
  - a first MEMS component connected between the first intermediate node and the second intermediate node so as to be in series between said first and second microstrip tracks; and
  - a second MEMS component, connected between the second intermediate node and a second node brought to the reference potential so as to be in parallel with said second microstrip track, said first and second MEMS components operating as a switch and being controlled by a control device controlling the open or closed state of each of said first and second MEMS components to place the filtering device in either an all-pass operating mode, or in a band-stop operating mode around a characteristic frequency of the resonator.

2. The reconfigurable filtering device according to claim 1, comprising a plurality of resonators, the resonators of the plurality of resonators being identical and connected in parallel along said transmission line, the control device selecting a number of resonators in the band-stop operating mode to adjust a rejection level of the filtering device.

3. The reconfigurable filtering device according to claim 2, wherein said plurality of resonators include (i) a plurality of first resonators characterized by a first characteristic frequency, and (ii) a plurality of second resonators characterized by a second characteristic frequency, the control device configured to select the number of resonators in the band-stop operating mode to adjust a rejection level of the filtering device around the first characteristic frequency or around the second characteristic frequency.

4. The reconfigurable filtering device according to claim 1, wherein the first capacitor and/or the second capacitor comprises a metal-insulator-metal capacitor.

5. The reconfigurable filtering device according to claim 1, wherein said first resonator microstrip track has a first impedance and said second resonator microstrip track has a second impedance, the first and second impedances being different so that said resonator has an impedance jump.

6. The reconfigurable filtering device according to claim 1, wherein said first MEMS component and/or said second MEMS component of the resonator comprises a capacitive MEMS component.

7. The reconfigurable filtering device according to claim 6, wherein said first and second MEMS components comprise, respectively, a membrane suspended by the ends thereof above a contact, the control device being configured to apply an actuation potential on the membrane and/or on the contact to deform the membrane so as to establish electrical continuity between the membrane and the contact.

8. The reconfigurable filtering device according to claim 7, wherein the control device comprises a resistive line section for bringing the contact to the actuation potential.

9. The reconfigurable filtering device according to claim 8, wherein an end portion of the resistive line section, located close to the contact, is shaped in a meander so as to have a high resistance for the contact.

10. A radiofrequency signal acquisition system comprising a filtering device, according to claim 1.

* * * * *